(12) United States Patent
Tajiri et al.

(10) Patent No.: US 8,517,590 B2
(45) Date of Patent: Aug. 27, 2013

(54) LIGHT SOURCE STRUCTURE

(75) Inventors: Tomohisa Tajiri, Osaka (JP); Yuto Suzuki, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 218 days.

(21) Appl. No.: 13/096,098

(22) Filed: Apr. 28, 2011

(65) Prior Publication Data
US 2011/0273904 A1   Nov. 10, 2011

(30) Foreign Application Priority Data
May 6, 2010   (JP) .................................. 2010-106466

(51) Int. Cl.
F21V 7/04    (2006.01)
B60Q 1/06    (2006.01)
F21V 1/06    (2006.01)

(52) U.S. Cl.
USPC .......................... 362/618; 362/632; 362/373

(58) Field of Classification Search
USPC .......................................... 362/618, 632–634
See application file for complete search history.

(56) References Cited

U.S. PATENT DOCUMENTS

| | | | |
|---|---|---|---|
| 6,428,189 B1 * | 8/2002 | Hochstein | 362/373 |
| 6,498,355 B1 * | 12/2002 | Harrah et al. | 257/99 |
| 6,920,046 B2 * | 7/2005 | Spryshak | 361/704 |
| 6,999,318 B2 * | 2/2006 | Newby | 361/719 |
| 7,175,329 B1 * | 2/2007 | Chou | 362/612 |
| 7,296,916 B2 * | 11/2007 | Ouderkirk et al. | 362/373 |
| 7,360,941 B2 * | 4/2008 | Yoon et al. | 362/632 |
| 7,677,899 B2 * | 3/2010 | Low | 439/56 |
| 2006/0131601 A1 * | 6/2006 | Ouderkirk et al. | 257/99 |
| 2008/0180972 A1 * | 7/2008 | Sakamoto et al. | 362/613 |
| 2008/0316771 A1 * | 12/2008 | Mori et al. | 362/633 |
| 2009/0201699 A1 * | 8/2009 | Ohno | 362/634 |
| 2010/0123847 A1 * | 5/2010 | Jeong et al. | 349/58 |
| 2010/0128195 A1 * | 5/2010 | Li et al. | 349/58 |

FOREIGN PATENT DOCUMENTS

| | | |
|---|---|---|
| JP | 2006-308738 A | 11/2006 |
| JP | 2008-166304 A | 7/2008 |
| JP | 2009-169204 A | 7/2009 |

* cited by examiner

Primary Examiner — David J Makiya
(74) Attorney, Agent, or Firm — Global IP Counselors

(57) ABSTRACT

A light source structure includes a light-emitting diode, an optical component, a frame and a mounting substrate. The light-emitting diode emits light. The frame has an inside face defining an inside area and outside face with an attachment opening extending between the inside and outside faces. The light-emitting diode is disposed in the attachment opening to emit the light toward the inside area of the frame. The frame houses the optical component in the inside area of the frame. The mounting substrate has a base member, a copper layer that is laminated on the base member, and a resist film that is laminated on the copper layer. The resist film has a first aperture with the light-emitting diode extending through the first aperture such that the light-emitting diode is electrically coupled to and mounted on the copper layer. The mounting substrate is disposed on the outside face of the frame.

12 Claims, 7 Drawing Sheets

LIGHT SOURCE STRUCTURE

CROSS-REFERENCE TO RELATED APPLICATIONS

This application claims priority to Japanese Patent Application No. 2010-106466 filed on May 6, 2010. The entire disclosure of Japanese Patent Application No. 2010-106466 is hereby incorporated herein by reference.

BACKGROUND

1. Field of the Invention

The present invention generally relates to a light source structure. More specifically, the present invention relates to a light source structure for a planar light-emitting device.

2. Background Information

FIG. 10 is an exploded cross sectional view of a conventional light source attachment structure. FIG. 11 is a cross sectional view of the conventional light source attachment structure. In FIGS. 10 and 11, an LED-mounted substrate 110 is faulted by sequentially laminating a base material 111, a copper plate 112 formed on the surface of the base material 111, and a resist film (e.g., insulation layer) 113 formed on substantially the entire surface of the base material 111 so as to cover the copper plate 112. In this LED-mounted substrate 110, a light-emitting diode (LED) 120 as a light source is soldered to the copper plate 112 by utilizing an opening 114 formed in the resist film 113. In other words, the LED 120 inserted into the opening 114 of the resist film 113 is soldered to the copper plate 112 by using solder 130. In FIG. 10, the reference numeral 121 refers to a thermal pad provided to the LED 120. The thermal pad 121 is placed in contact with the copper plate 112 by soldering of the LED 120 to the copper plate 112.

The LED-mounted substrate 110 on which the LED 120 is mounted is bonded to an inside surface 141 of a frame 140 which houses a light guide plate or other optical component not shown in the drawing, by using an adhesive tape 150.

In the light source attachment structure configured as described above, a heat transfer path for radiating the generated heat of the LED 120 is formed by the thermal pad 121, the solder 130, the base material 111, the adhesive tape 150, and the frame 140. Consequently, the thermal pad 121, the solder 130, the base material 111, and the adhesive tape 150 which form the heat transfer path are disposed on the inside of the frame 140. Furthermore, the base material 111 is made of a non-conductive material having low thermal conductivity. Thus, heat is easily trapped around the LED 120 in the internal space of the frame 140. Therefore, even when the frame 140 is metallic in order to increase the heat dissipation properties thereof, the trapping of heat around the LED 120 compromises the ability to increase the heat dissipation properties of the LED 120.

In the light source attachment structure described above, in the step of attaching the LED-mounted substrate 110 to the frame 140, the adhesive tape 150 must be used to bond the LED-mounted substrate 110 to the inside surface 141 of the frame 140 from the inside of the frame 140 which houses the optical component. Therefore, in this attachment step, bonding the LED-mounted substrate 110 to the inside surface 141 of the frame 140 while avoiding the installation location of the light guide plate or other optical component requires that the attachment operation be performed in a narrow space. Furthermore, damage is also prone to occur by interference of the LED 120 with other components.

In the light source attachment structure of the conventional example described with reference to FIG. 11, the base material 111 made of a non-conductive material having low thermal conductivity is interposed in the heat transfer path for radiating the generated heat of the LED 120. Thus, heat is easily trapped around the LED 120 in the internal space of the frame 140, as described above.

Another conventional light source attachment structure is also known. In the light source attachment structure, a metal base material, which is a material having good thermal conductivity, is used instead of the base material 111 of the LED-mounted substrate 110 shown in FIG. 11. However, when such metal base material is used, a thin electrical insulation layer must be interposed between the metal base material and the copper plate to which an LED is soldered. As a result, the interposition of the electrical insulation layer in the heat transfer path for radiating the generated heat of the LED compromises the ability to obtain adequate heat dissipation properties.

Further another conventional light source attachment structure has also been proposed. In the light source attachment structure, copper plates are formed on both the front and back surfaces of a base material that is the same as that used in the LED-mounted substrate 110 shown in FIG. 11. An LED is soldered to the copper plate of one side. Through-holes which penetrate through the base material are formed in numerous locations. With this light source attachment structure, the heat of the LED is readily transferred by air flowing through the through holes from the copper plate on the front side of the base material to the copper plate connectedly provided on the back side of the base material. Thus, heat dissipation effects are correspondingly improved. However, an adequate surface area for heat transfer to the copper plate on the back side of the base material is difficult to ensure merely by forming the through-holes, and the improvement to heat dissipation properties is limited.

Various proposals have been made for radiating generated heat of a light source LED (see Japanese Laid-Open Patent Application Publications Nos. 2009-169204, 2008-166304 and 2006-308738, for example).

For example, a light source attachment structure is employed in a liquid crystal display device (see Japanese Laid-Open Patent Application Publication No. 2009-169204, for example). In this light source attachment structure, an LED-mounted substrate is formed by mounting an in-line arranged LED on a flexible printed substrate (FPC) 101. The LED-mounted substrate is attached to a heat conducting plate made of aluminum. The heat conducting plate is attached in a state of contact with an inside surface of a casing. In the LED-mounted substrate, the LED is mounted in a state of penetrating through the FPC. The LED contacts with the heat conducting plate.

With this light source attachment structure, the generated heat of the LED is efficiently transferred to the casing through the heat conducting plate. Thus, the heat dissipation properties of the LED can also be enhanced. However, the LED-mounted substrate is disposed inside the casing. Thus, the step of attaching the LED-mounted substrate to the inside surface of the casing requires that the attachment operation be performed in a narrow space. As a result, damage is also prone to occur by interference of the LED with other components. The LED-mounted substrate is also disposed inside the casing. Thus, heat around the LED is easily trapped in the internal space of the casing. Therefore, in the light source attachment structure, a transparent plate having high thermal conductivity, attached to the casing, is disposed in the space between the LED and a light guide plate. In this structure, the heat trapped around the LED in the internal space of the casing is allowed to escape through the transparent plate. However, providing the transparent plate causes problems in that the intensity of the light introduced to the light guide plate from the LED is reduced by passing through the transparent plate. Thus, the efficiency with which the light of the LED is utilized is reduced.

Another conventional structure includes a thermal via or other through-hole for heat dissipation in a wiring substrate on which an LED is mounted (see Japanese Laid-Open Patent Application Publication No. 2008-166304, for example). With further another conventional structure, an LED-mounted substrate is bonded to a heat sink through the use of a thermally conductive adhesive. However, the above-mentioned techniques require attaching an LED to the inside surface of a frame. Consequently, it has been discovered that with the techniques, the problem of reduced operating efficiency of attachment, and the problem of heat being easily trapped in the internal space of the frame are impossible to avoid.

SUMMARY

It has been discovered that with the conventional structures described above, although various measures are proposed for improving the heat dissipation properties of an LED, none of these proposed techniques is capable of overcoming the problem of reduced heat dissipation properties due to trapping of heat in the internal space of the frame. Furthermore, it has also been discovered that there is a limit to the degree to which the working efficiency of assembly is enhanced during attachment of the LED-mounted substrate to the frame.

The present invention was conceived in light of the above-mentioned problems. One object of the present invention is to provide a light source structure whereby heat dissipation properties are not prone to be reduced by trapping of heat in an internal space of a frame, and working efficiency of assembly can be enhanced during attachment of a substrate to a frame.

In accordance with one aspect, a light source structure includes a light-emitting diode, an optical component, a frame and a mounting substrate. The light-emitting diode is configured to emit light. The optical component is configured to receive and emit the light from the light-emitting diode. The frame has an inside face defining an inside area and outside face with an attachment opening extending between the inside and outside faces. The light-emitting diode is disposed in the attachment opening to emit the light toward the inside area of the frame. The frame houses the optical component in the inside area of the frame. The mounting substrate has a base member, a copper layer that is laminated on the base member, and a resist film that is laminated on the copper layer. The resist film has a first aperture with the light-emitting diode extending through the first aperture such that the light-emitting diode is electrically coupled to and mounted on the copper layer. The mounting substrate is disposed on the outside face of the frame.

With the light source structure, it is possible to provide a light source structure whereby heat dissipation properties are not prone to be reduced by trapping of heat in an internal space of a frame, and working efficiency of assembly can be enhanced during attachment of a substrate to a frame.

These and other objects, features, aspects and advantages will become apparent to those skilled in the art from the following detailed description, which, taken in conjunction with the annexed drawings, discloses a preferred embodiment.

BRIEF DESCRIPTION OF THE DRAWINGS

Referring now to the attached drawings which form a part of this original disclosure.

DETAILED DESCRIPTION OF EMBODIMENTS

A preferred embodiment will now be explained with reference to the drawings. It will be apparent to those skilled in the art from these disclosures that the following descriptions of the preferred embodiment are provided for illustration only and not for the purpose of limiting the invention as defined by the appended claims and their equivalents.

Referring to FIGS. 1-7, a light source attachment structure (e.g., light source structure) for an edge-type planar light-emitting device will be descried in detail. The planar light-emitting device is used as a backlight for a liquid crystal module, a liquid crystal display device and the like.

Figure 1:
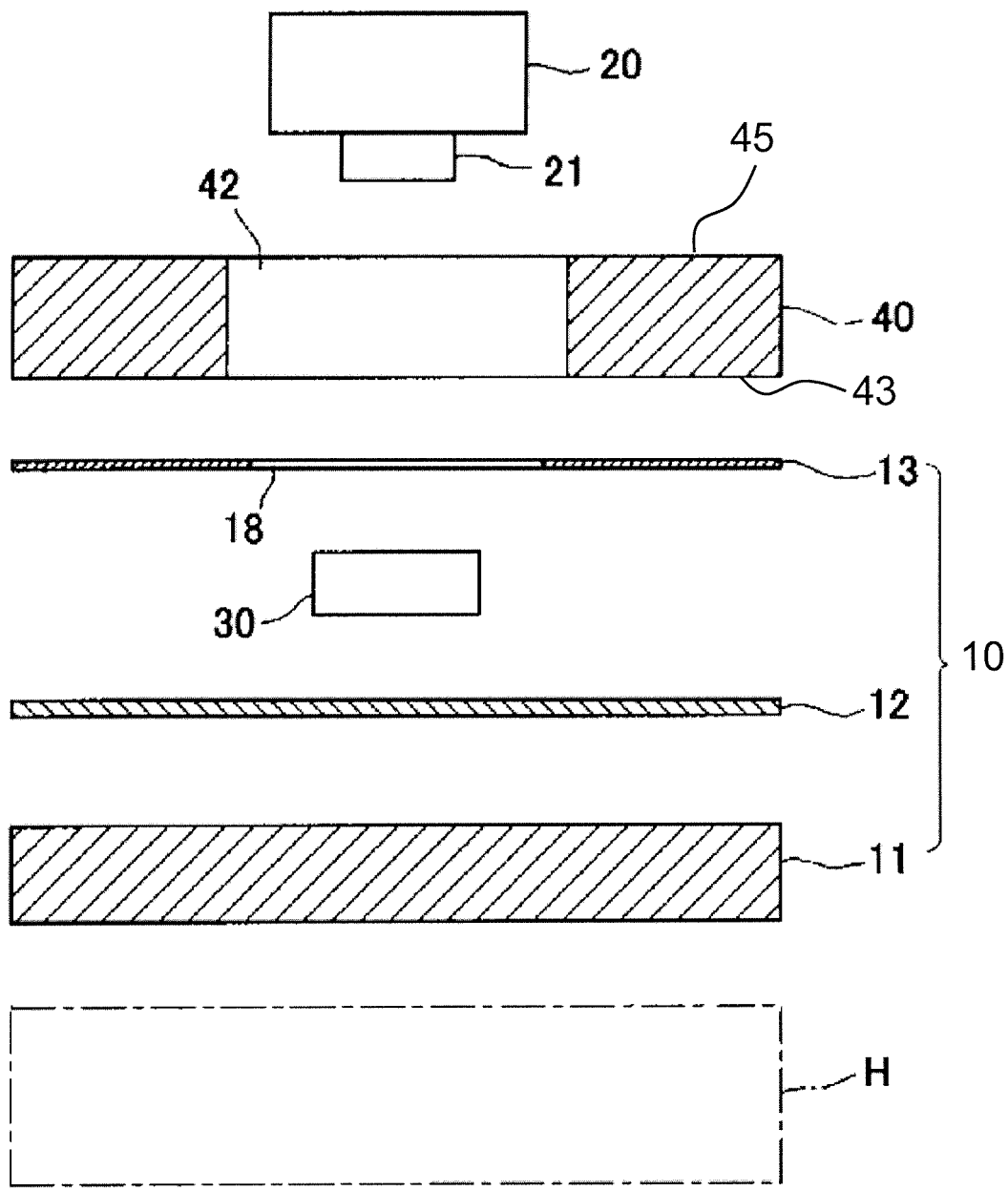
FIG. 1 is an exploded cross sectional view illustrating a light source attachment structure for a planar light-emitting device in accordance with one embodiment.
Figure 2:
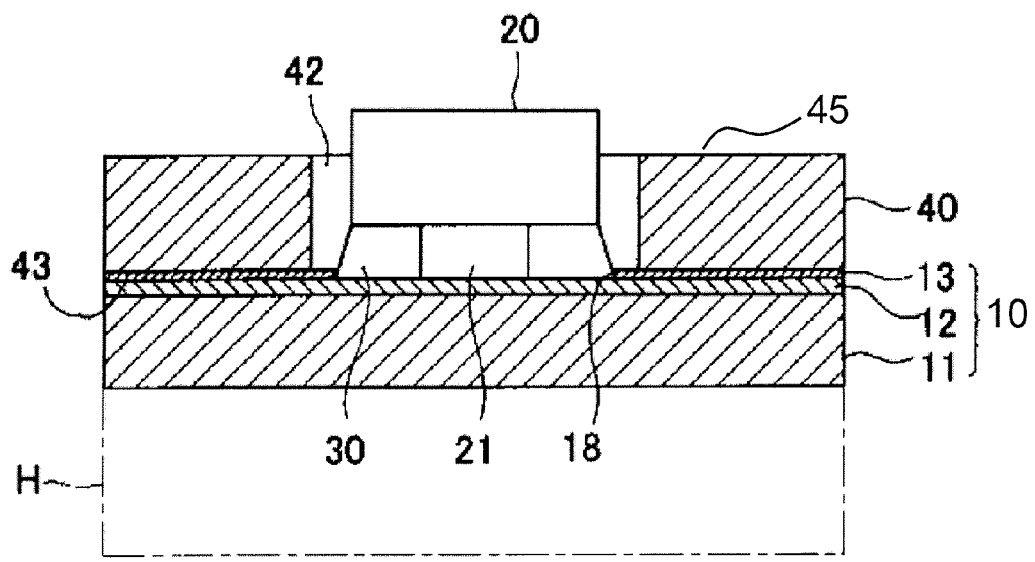
FIG. 2 is a cross sectional view of the light source attachment structure taken along II-II line in FIG. 6.
Figure 6:
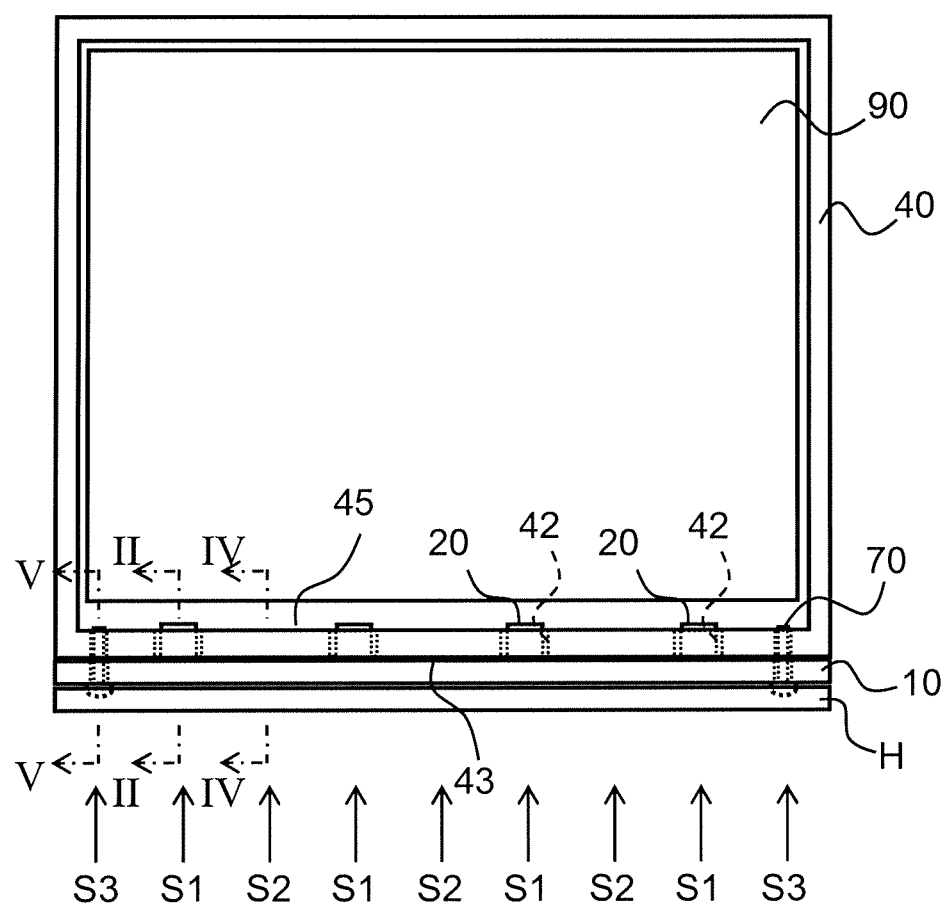
FIG. 6 is a front elevational view of the planar light-emitting device.
Figure 7:
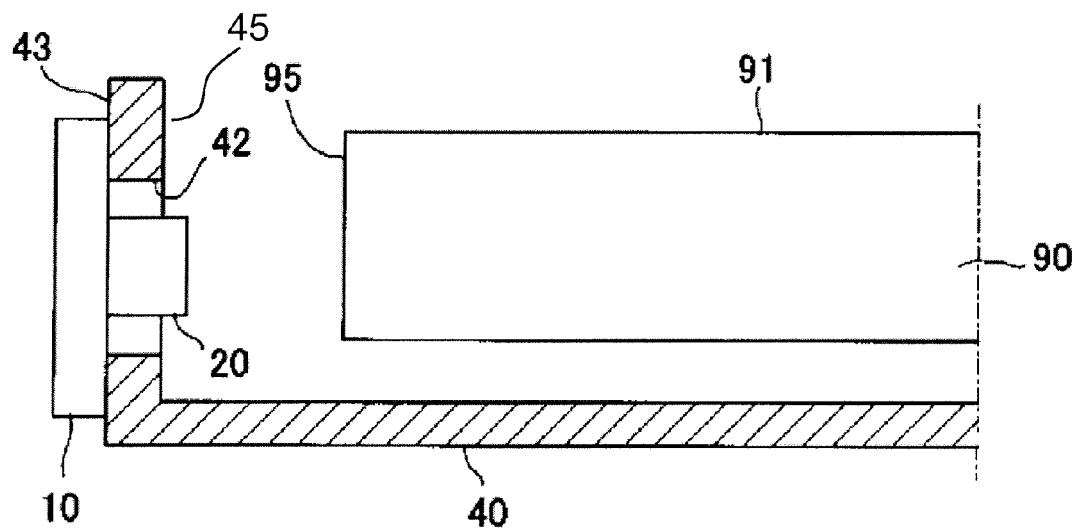
FIG. 7 is a detailed cross sectional view of the planar light-emitting device.

As shown in FIGS. 1, 2, 6 and 7, the planar light-emitting device has an LED-mounted substrate (e.g., mounting substrate) 10, a plurality of LEDs (e.g., light-emitting diode) 20, a plurality of solders 30, a frame 40, a heat sink H, and a light guide plate 90. FIGS. 1, 2 and 7 are a cross sectional view of portions S1 of the planar light-emitting device shown in FIG. 6. The LED-mounted substrate 10 has a base material (e.g., base member) 11, a copper plate (e.g., copper layer) 12, and a resist film 13. The base material 11 is made of a non-conductive material having low thermal conductivity. The copper plate 12 is formed on (e.g., laminated on) a surface of the base material 11. The resist film (e.g., insulation layer) 13 covers a surface of the copper plate 12. The resist film 13 electrically insulates between the frame 40 and the copper plate 12. The resist film 13 has a plurality of openings (e.g., first aperture) 18. The LEDs 20 are mounted on the LED-mounted substrate 10. Specifically, the LEDs 20 are soldered and mounted on a plurality of locations of the copper plate 12 that is exposed through the openings 18, respectively. The LEDs 20 are electrically coupled to the copper plate 12. Each of the LEDs 20 is also provided with a thermal pad 21. The thermal pads 21 are appressed to the copper plate 12 by the soldering of the LEDs 20 to the copper plate 12, respectively. The thermal pads 21 and the solders 30 have a higher thermal conductivity than the resist film 13. Each of the openings 18 of the resist film 13 has an open area (e.g., aperture area) which is necessary and adequate for respective one of the LEDs 20 to be soldered to the copper plate 12. The light source attachment structure for the planar light-emitting device attaches the LED-mounted substrate 10 on which the LEDs 20 are mounted to the frame 40.

As shown in FIGS. 1, 2, 6 and 7, the frame 40 houses the light guide plate 90, a light diffusion plate (not shown), or another optical component (not shown) which is provided with surface-emitting functionality. The frame 40 is made of metal, and is integrally formed as a one-piece, unitary member. The frame 40 has a back plate, and upper, lower, left and right side plates extending form the back plate, respectively. Inside surfaces of the upper and lower side plates of the frame 40 or inside surfaces of the left and right side plates of the frame 40 define an inner space (e.g., inside area) of the frame 40 (e.g., inside of frame) therebetween, respectively. In other words, the lower side plate of the frame 40 separates the inner space of the frame 40 from an outer space (e.g., outside of frame) of the frame 40. The lower side plate of the frame 40 has the inside surface 45 and an outside surface (e.g., outside face) 43. As shown in FIG. 6, the lower side plate of the frame 40 has a plurality of attachment openings 42 through which the LEDs 20 are inserted, respectively, and emit the light inner space of the frame 40. The attachment openings 42 are formed in the lower side plate of the frame 40. The attachment openings 42 extend between the inside and outside surfaces 45, 43 of the lower side plate of the frame 40. The LED-mounted substrate 10, i.e., the resist film 13, copper plate 12, and base material 11, are fixed in a state of superposition on the outside surface 43 of the lower side plate of the frame 40, as shown in FIG. 2. The LEDs 20 of the LED-mounted substrate 10 face the light guide plate 90 or the optical component housed in the frame 40, respectively. The light emitted from the LEDs 20 is introduced to the light guide plate 90 or the optical component. Then, the light guide plate 90 or the optical component performs surface emission. The attachment openings 42 of the frame 40 have the necessary and adequate size to allow insertion of the LEDs 20, respectively. The frame 40 and the copper plate 12 of the LED-mounted substrate 10 are electrically insulated from each other by the resist film 13. The heat sink H is made of aluminum or another metal. The heat sink H is superposed on the base material 11 of the LED-mounted substrate 10 as shown in FIG. 2.

Figure 3:
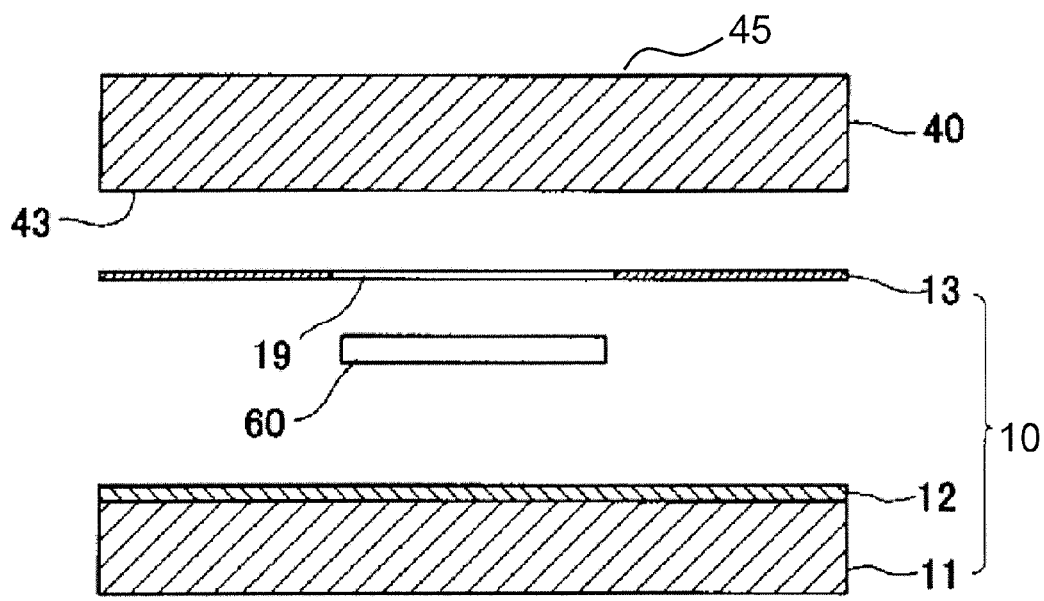
FIG. 3 is an exploded cross sectional view illustrating a bonding structure of a frame and an LED-mounted substrate of the light source attachment structure.
Figure 4:
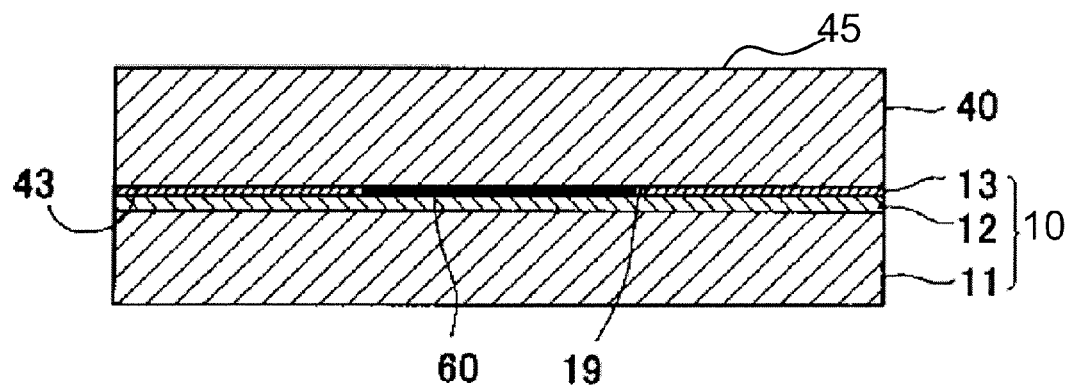
FIG. 4 is a cross sectional view of the bonding structure of the light source attachment structure taken along IV-IV line in FIG. 6.

FIGS. 3 and 4 are a cross sectional view of portions S2 of the planar light-emitting device shown in FIG. 6. Although not shown in FIG. 3, on the frame 40, the LED-mounted substrate 10 is fixed in a state of superposition on the outside surface 43 of the frame 40, as shown in FIG. 2. As shown in FIG. 3, the planar light-emitting device further includes a thermally conductive adhesive tape 60 as a heat transfer member at each portion S2. The adhesive tape 60 has a higher thermal conductivity than the resist film 13. The adhesive tapes 60 are a pressure-sensitive adhesive tape which is treated to increase the thermal conductivity thereof. The resist film 13 covering the copper plate 12 also has a removed part (e.g., second aperture) 19 at each portion S2. A plurality of portions of the resist film 13 is removed at the removed parts 19. A plurality of portions of the copper plate 12 thereby is exposed through the removed parts 19, respectively. The exposed portions of the copper plate 12 and the outside surface 43 of the frame 40 are joined through the use of the adhesive tapes 60. In other words, the adhesive tapes 60 thermally couple the outside surface 43 of the frame 40 to the copper plate 12 through the removed parts 19. When this configuration is employed in the bonding structure of the frame 40 and the LED-mounted substrate 10, the frame 40 is thermally connected to the copper plate 12 of the LED-mounted substrate 10 via the adhesive tapes 60 as a heat transfer member. Consequently, through this configuration, the generated heat of the LEDs 20 shown in FIG. 2 and other drawings is also transferred to the frame 40 by the adhesive tapes 60 as a heat transfer member that is used to bond the frame 40 and the LED-mounted substrate 10. An advantage is therefore gained in that the heat transfer properties of the bonding portions of the frame 40 and the LED-mounted substrate 10 are not blocked by the resist film 13. The adhesive tapes 60 are used as a heat transfer member. If electrical conductivity is imparted to the adhesive tapes 60, then advantage is gained in that the LEDs 20 mounted on the LED-mounted substrate 10 are easily electrically grounded.

Figure 5:
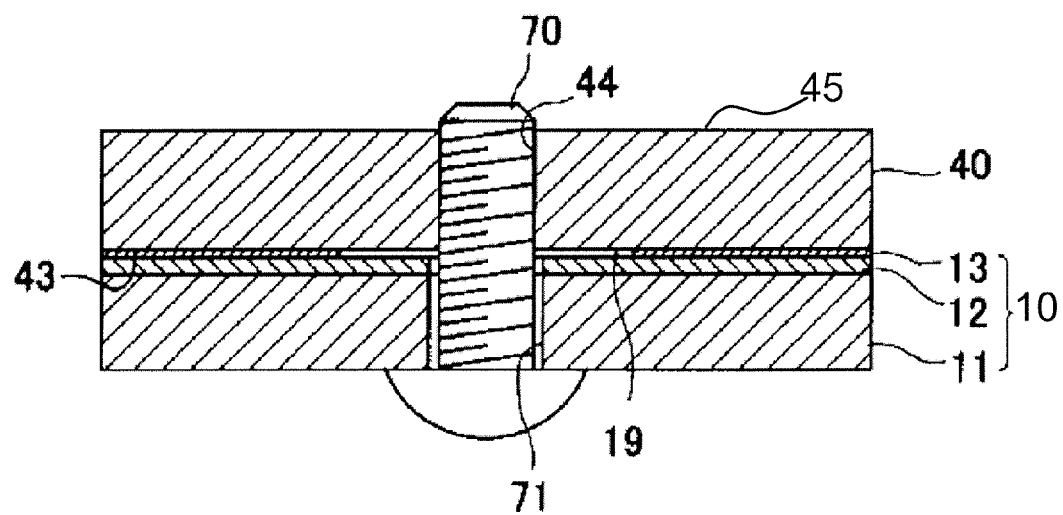
FIG. 5 is a cross sectional view of another bonding structure of the frame and the LED-mounted substrate of the light source attachment structure taken along V-V line in FIG. 6.

FIG. 5 is a cross sectional view of portions S3 of the planar light-emitting device shown in FIG. 6. Although not shown in FIG. 5, on the frame 40, the LED-mounted substrate 10 (resist film 13, copper plate 12, and base material 11) is fixed in a state of superposition on the outside surface 43 of the frame 40, as shown in FIG. 2. As shown in FIG. 5, the planar light-emitting device further includes a metal fastening screw 70 as a heat transfer member at each portion S3. The fastening screws 70 have a higher thermal conductivity than the resist film 13. In the LED-mounted substrate 10, the resist film 13 covering the copper plate 12 has a removed part 19 formed by removing portion of the resist film 13 at each portion S3. The LED-mounted substrate 10 further includes a screw insertion hole 71 at a location corresponding to the removed part 19 of the resist film 13 in the LED-mounted substrate 10 at each portion S3. A screw hole 44 is also formed in the frame 40 at each portion S3. The fastening screws 70 inserted in the screw insertion holes 71 of the LED-mounted substrate 10 are screwed into the screw holes 44 of the frame 40, respectively. Through this configuration, the metal fastening screws 70 serve to radiate the internal heat of the frame 40 to the outside. Consequently, an advantage is gained in that the heat transfer properties of the bonding part of the frame 40 and the LED-mounted substrate 10 are not blocked by the resist film 13.

In the embodiment described above, the LED-mounted substrate 10 is bonded to the outside surface of the frame 40. The step of attaching the LED-mounted substrate 10 to the frame 40 can therefore be performed in the large space on the outside of the frame 40. For example, when the adhesive tapes 60 shown in FIG. 4 are used to bond the frame 40 and the LED-mounted substrate 10, the adhesive tapes 60 are joined to the frame 40 at the same time that the LED-mounted substrate 10, to which the adhesive tapes 60 are affixed in advance, is superposed on the outside surface 43 of the frame 40. When the fastening screws 70 shown in FIG. 5 are used to bond the frame 40 and the LED-mounted substrate 10, after the LED-mounted substrate 10 is superposed on the outside surface 43 of the frame 40, the fastening screws 70 are inserted in the screw insertion holes 71 and screwed into the screw holes 44 of the frame 40, respectively.

In the edge-type planar light-emitting device shown in FIGS. 6 and 7, the LED-mounted substrate 10 is attached to the outside surface 43 of the lower side plate of the frame 40. The LEDs 20 mounted on the LED-mounted substrate 10 are inserted in the attachment openings 42 of the lower side plate of the frame 40, respectively. The light guide plate 90 as an optical component is disposed on the inside of the frame 40.

The LEDs 20 face a lateral end surface (e.g., side end surface) of the light guide plate 90, respectively. Through this configuration, the light of the LEDs 20 is introduced to the light guide plate 90 from a light entrance surface 95 formed by the lateral end surface of the light guide plate 90. As a result, surface emission is performed by a light-emitting surface 91 at the surface of the light guide plate 90.

Figure 8:
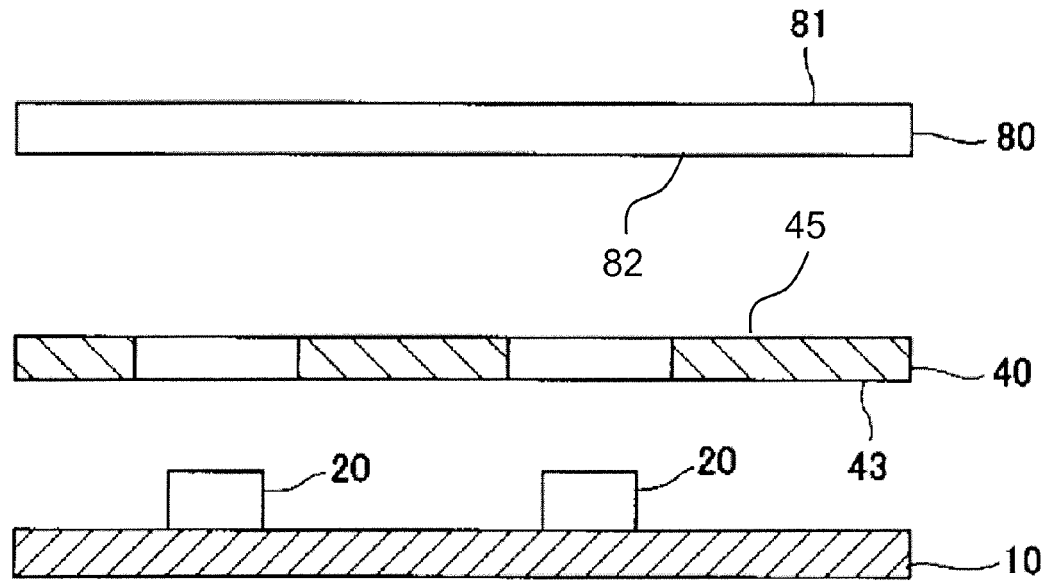
FIG. 8 is an exploded cross sectional view of another planar light-emitting device.

The light source attachment structure (or the bonding structure) illustrated in FIGS. 1-5 can also be applied to different types of planar light-emitting devices. Specifically, as shown in FIG. 8, the structure illustrated in FIGS. 1-5 can be applied to a direct-type planar light-emitting device. In the direct-type planar light-emitting device, the LED-mounted substrate 10 is attached to the outside surface 43 of the rear plate of the box-shaped frame 40. The LEDs 20 mounted on the LED-mounted substrate 10 are inserted in the attachment openings 42 formed on the rear plate of the frame 40, respectively. More specifically, the LEDs 20 are vertically and horizontally arranged on the LED-mounted substrate 10 along an upper face of the LED-mounted substrate 10, and are inserted in the attachment openings 42 that are formed on the rear plate of the frame 40, respectively. A light diffusion plate 80 as an optical component is disposed on the inside of the frame 40. The LEDs 20 face a back surface (e.g., lower surface) of the light diffusion plate 80. Through this configuration, the light of the LEDs 20 is diffused by the light diffusion plate 80. As a result, surface emission is performed by a light-emitting surface (e.g., upper surface) 81 at the surface of the light diffusion plate 80.

Figure 9:
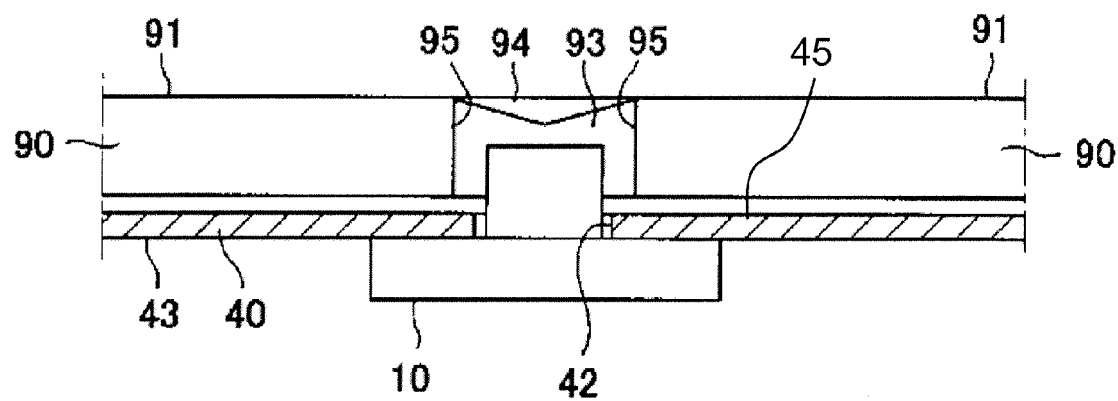
FIG. 9 is an exploded cross sectional view of further another planar light-emitting device.
Figure 10:
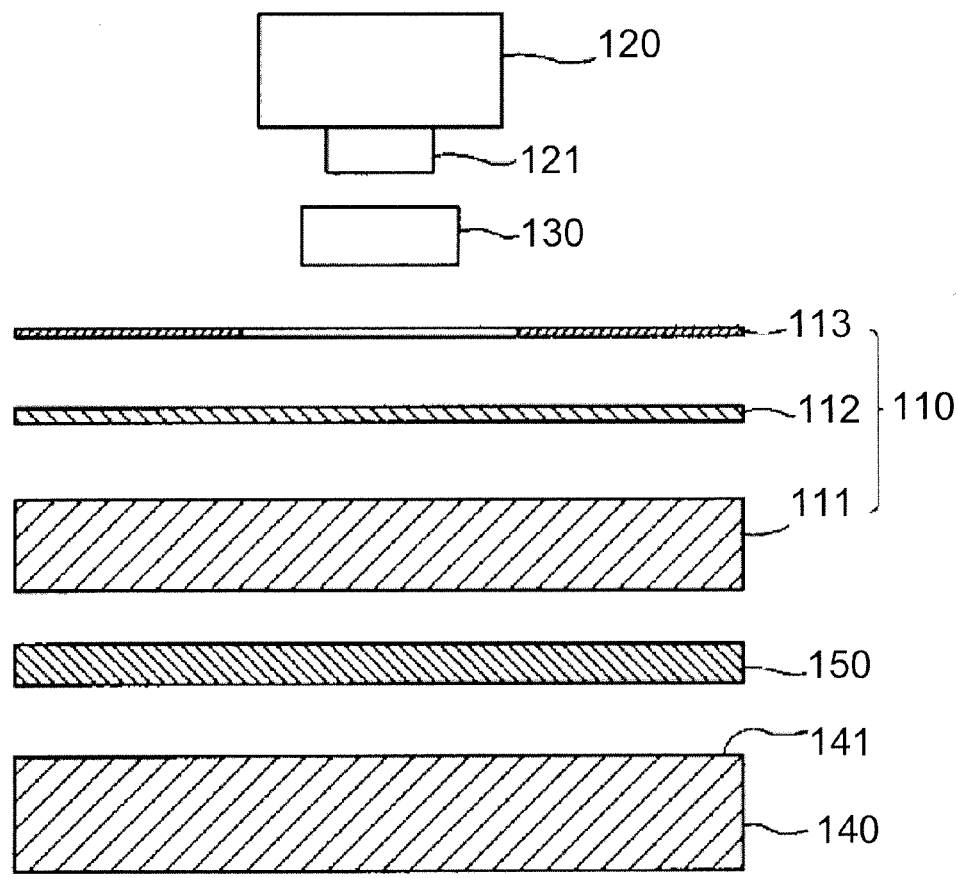
FIG. 10 is an exploded cross sectional view of a conventional light source attachment structure.
Figure 11:
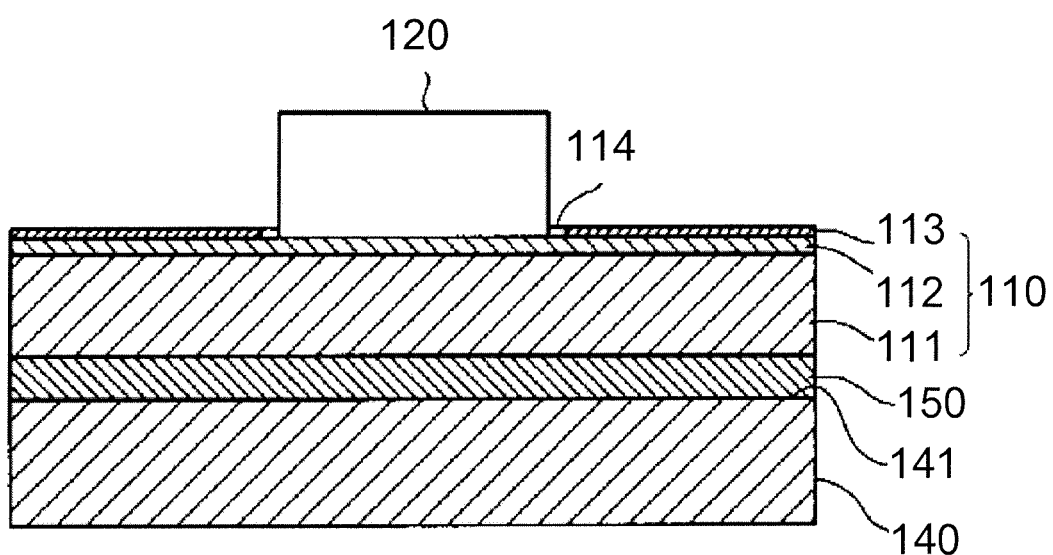
FIG. 11 is a cross sectional view of the conventional light source attachment structure illustrated in FIG. 10.

Furthermore, as shown in FIG. 9, the structure illustrated in FIGS. 1-5 can also be applied to another type of edge-type planar light-emitting device. In the edge-type planar light-emitting device shown in FIG. 9, the LED-mounted substrate 10 is attached to the outside surface 43 of the rear plate of the box-shaped frame 40. The LEDs 20 mounted on the LED-mounted substrate 10 are inserted in the attachment openings 42 formed on the rear plate of the frame 40. The light guide plate 90 as an optical component is disposed on the inside of the frame 40. The LEDs 20 are accommodated in depressions 93 formed in the light guide plate 90, respectively. Light reflectors 94 for reflecting the light of the LEDs 20 sideways are provided in the depressions 93, respectively. Through this configuration, the light of the LEDs 20 is reflected sideways by the light reflectors 94, respectively. Then, the reflected light is introduced to the light guide plate 90 from the light entrance surfaces 95 formed by the inside wall surfaces of the depressions 93, respectively. As a result, surface emission is performed by the light-emitting surface 91 at the surface of the light guide plate 90.

As described above, the light source attachment structure for the planar light-emitting device has the LEDs 20 as a light source, the LED-mounted substrate 10 in which the copper plate 12 and the resist film 13 are sequentially laminated on the base material 11, and the frame 40 for housing the optical component for performing surface emission by introducing and emitting the light of the LEDs 20. The LED-mounted substrate 10 on which the LEDs 20 are mounted is attached to the frame 40. The light of the LEDs 20 is introduced to the optical component. The openings 18 are provided in the resist film 13 of the LED-mounted substrate 10. The LEDs 20 are soldered to and mounted on the copper plate 12 exposed from the openings 18 on the LED-mounted substrate 10. The LED-mounted substrate 10 is disposed on the outside of the metal frame 40. The LEDs 20 mounted on the LED-mounted substrate 10 are brought to face the inside of the frame 40 through the attachment openings 42 provided to the frame 40. The frame 40 is thermally connected to the copper plate 12 of the LED-mounted substrate 10 via the heat transfer member 21, 30, 60, 70.

In the configuration described above, the light source attachment structure includes the LED-mounted substrate 10 and the LEDs 20 that are soldered and mounted on the copper plate 12 exposed from the openings 18 of the resist film 13 of the LED-mounted substrate 10. In the LED-mounted substrate 10, the generated heat of the LEDs 20 is transferred to the copper plate 12 without being blocked by the resist film 13. Furthermore, with the light source attachment structure, the LED-mounted substrate 10 is disposed on the outside of the frame 40. The frame 40 is thermally connected to the copper plate 12 of the LED-mounted substrate 10 via the heat transfer member 21, 30, 60, 70. The heat transfer path for radiating the generated heat of the LEDs 20 is formed by the copper plate 12 and the frame 40. The generated heat of the LEDs 20 is therefore efficiently radiated by the frame 40. As a result, the phenomenon (heat trapping phenomenon) whereby the heat of the LEDs 20 is trapped in the internal space of the frame 40 is no longer prone to occur.

With the light source attachment structure, the LED-mounted substrate 10 is disposed on the outside of the frame 40, and only the LEDs 20 thereof are brought to face the inside of the frame 40 through the attachment openings 42 of the frame 40, as described above. Thus, the step of attaching the LED-mounted substrate 10 to the frame 40 can be performed in the large space on the outside the frame 40. The working efficiency of assembly or replacement of the LED-mounted substrate 10 is thereby enhanced.

Furthermore, the heat transfer member can be the thermally conductive pressure-sensitive adhesive tapes 60 for bonding the outside surface 43 of the frame 40 and the copper plate 12 of the LED-mounted substrate 10. The adhesive tapes 60 are disposed in portions where the resist film 13 formed on the LED-mounted substrate 10 is absent. When the adhesive tapes 60 are used as the heat transfer member, the adhesive tapes 60 preferably have electrical conductivity. When the adhesive tapes 60 have electrical conductivity in this manner, the LEDs 20 of the LED-mounted substrate 10 is easily grounded.

With the light source attachment structure, the heat transfer member can be the metal fastening screws 70 for joining the LED-mounted substrate 10 and the frame 40. Through this configuration, thermal conductivity at the joint between the LED-mounted substrate 10 and the frame 40 is improved, and this improvement contributes to increasing the heat dissipation properties of the LEDs 20.

With the light source attachment structure, the optical component can includes the light guide plate 90 housed in the frame 40. With the light guide plate 90, the upper surface 91 of the light guide plate 90 can be a light-emitting surface, and the side end surface 95 of the light guide plate 90 facing the LEDs 20 can be a light entrance surface. Furthermore, the optical component also can include the light diffusion plate 80 housed in the frame 40. With the light diffusion plate 80, the upper surface of the light diffusion plate 80 can be the light-emitting surface 81, and the back surface (or lower surface) 82 of the light diffusion plate 80 faces the LEDs 20. The former configuration can be applied to an edge-type planar light-emitting device, and the latter configuration can be applied to a direct-type planar light-emitting device.

As described above, through the light source attachment structure for the planar light-emitting device, the LED-mounted substrate 10 is disposed on the outside of the frame 40, and the heat transfer path for radiating the generated heat of the LEDs 20 is formed by the copper plate 12 and the frame 40. The generated heat of the LEDs 20 is therefore efficiently radiated by the frame 40, and the phenomenon of heat being trapped in the internal space of the frame 40 is no longer prone to occur. As a result, the heat dissipation properties of the LEDs 20 are increased, and the durable service life or performance reliability of the LEDs 20 is enhanced.

The LED-mounted substrate 10 is disposed on the outside of the frame 40, and only the LEDs 20 is brought to face the inside of the frame 40 through the attachment openings 42 of the frame 40. Thus, the step of attaching the LED-mounted substrate 10 to the frame 40 can be performed in the large space on the outside the frame 40. This ability contributes to enhancing the working efficiency of assembly of the LED-mounted substrate 10.

GENERAL INTERPRETATION OF TERMS

In understanding the scope of the present invention, the term "comprising" and its derivatives, as used herein, are intended to be open ended terms that specify the presence of the stated features, elements, components and groups, but do not exclude the presence of other unstated features, elements, components and groups. The foregoing also applies to words having similar meanings such as the terms, "including", "having" and their derivatives. Also, the terms "part," "section," "portion," "member" or "element" when used in the singular can have the dual meaning of a single part or a plurality of parts. As used herein to describe the present invention, the following directional terms "forward, rearward, above, downward, vertical, horizontal, below and transverse" as well as any other similar directional terms refer to those directions of a planar light-emitting device equipped with the present invention. Accordingly, these terms, as utilized to describe the present invention should be interpreted relative to a planar light-emitting device equipped with the present invention as used in the normal operating position.

While a preferred embodiment have been chosen to illustrate the present invention, it will be apparent to those skilled in the art from these disclosures that various changes and modifications can be made herein without departing from the scope of the invention as defined in the appended claims. Furthermore, the foregoing descriptions of the preferred embodiment according to the present invention are provided for illustration only, and not for the purpose of limiting the invention as defined by the appended claims and their equivalents.

What is claimed is:

1. A light source structure comprising:
a light-emitting diode configured to emit light;
an optical component configured to receive and emit the light from the light-emitting diode;
a frame having an inside face defining an inside area and outside face with an attachment opening extending between the inside and outside faces, the light-emitting diode being disposed in the attachment opening to emit the light toward the inside area of the frame, the frame housing the optical component in the inside area of the frame;
a mounting substrate having a base member, a copper layer that is laminated on the base member, and a resist film that is laminated on the copper layer with the resist film having a first aperture and a second aperture; and
a heat transfer member thermally connecting the frame to the mounting substrate,
the cooper layer having a first surface that contacts with the base member and a second surface that contacts with the resist film,
the light-emitting diode extending through the first aperture such that the light-emitting diode is electrically coupled to and mounted on the second surface of the copper layer that is exposed through the first aperture of the resist film,
the heat transfer member being mounted on the second surface of the copper layer that is exposed through the second aperture of the resist film,
the mounting substrate being disposed on the outside face of the frame.

2. The light source structure according to claim 1, wherein the heat transfer member has a higher thermal conductivity than the resist film of the mounting substrate.

3. The light source structure according to claim 1, wherein the heat transfer member includes a thermally conductive adhesive tape, the adhesive tape coupling the outside face of the frame to the copper layer of the mounting substrate through the second aperture formed on the resist film.

4. The light source structure according to claim 1, wherein the heat transfer member includes a metal fastening screw, the fastening screw coupling the mounting substrate to the frame.

5. The light source structure according to claim 1, wherein the frame is made of metal, the frame being integrally formed as a one-piece, unitary member.

6. The light source structure according to claim 1, wherein the light-emitting diode is soldered to and mounted on an exposed portion of the copper layer that is exposed through the first aperture of the resist film.

7. The light source structure according to claim 1, wherein the optical component includes a light guide plate, the light guide plate having a side end surface that faces the light-emitting diode with the side end surface being configured to receive the light from the light-emitting diode, and an upper surface that is configured to emit the light from the light-emitting diode.

8. The light source attachment structure according to claim 1, wherein
the optical component includes a light diffusion plate, the light diffusion plate having a lower surface that faces the light-emitting diode with the lower surface being configured to receive the light form the light-emitting diode, and an upper surface that is configured to emit the light from the light-emitting diode.

9. The light source attachment structure according to claim 1, wherein
the first and second apertures of the resist film are spaced apart from each other.

10. The light source attachment structure according to claim 1, wherein
the light-emitting diode has an end portion, the end portion of the light-emitting diode protruding relative to the inside surface of the frame towards the inside area of the frame.

11. The light source attachment structure according to claim 10, wherein
the end portion of the light-emitting diode has an end surface that is located farther away from the mounting substrate than the inside surface of the frame towards the inside area of the frame.

12. A light source structure comprising:
a light-emitting diode configured to emit light;
an optical component configured to receive and emit the light from the light-emitting diode;
a frame having an inside face defining an inside area and outside face with an attachment opening extending between the inside and outside faces, the light-emitting diode being disposed in the attachment opening to emit the light toward the inside area of the frame, the frame housing the optical component in the inside area of the frame;

a mounting substrate having a base member, a copper layer that is laminated on the base member, and a resist film that is laminated on the copper layer with the resist film having a first aperture; and a heat transfer member thermally connecting the frame to the mounting substrate, the heat transfer member including a thermally conductive adhesive tape, the adhesive tape coupling the outside face of the frame to the copper layer of the mounting substrate through a second aperture formed on the resist film, the adhesive tape having an electrical conductivity such that the mounting substrate is electrically grounded through the adhesive tape, the light-emitting diode extending through the first aperture such that the light-emitting diode is electrically coupled to and mounted on the copper layer, the mounting substrate being disposed on the outside face of the frame.

\* \* \* \* \*